(12) United States Patent
Wang et al.

(10) Patent No.: US 10,642,743 B2
(45) Date of Patent: May 5, 2020

(54) APPARATUS AND METHOD OF HANDLING CACHING OF PERSISTENT DATA

(71) Applicant: ARM Limited, Cambridge (GB)

(72) Inventors: Wei Wang, Cambridge (GB); Stephan Diestelhorst, Cambridge (GB); Wendy Arnott Elsasser, Austin, TX (US); Andreas Lars Sandberg, Cambridge (GB); Nikos Nikoleris, London (GB)

(73) Assignee: ARM LIMITED, Cambridge (GB)

( * ) Notice: Subject to any disclaimer, the term of this patent is extended or adjusted under 35 U.S.C. 154(b) by 0 days.

(21) Appl. No.: 16/005,934

(22) Filed: Jun. 12, 2018

(65) Prior Publication Data

US 2019/0004960 A1    Jan. 3, 2019

(30) Foreign Application Priority Data

Jun. 28, 2017  (GR) .............................. 20170100298

(51) Int. Cl.
*G06F 12/00* (2006.01)
*G06F 12/0873* (2016.01)
(Continued)

(52) U.S. Cl.
CPC ........ *G06F 12/0873* (2013.01); *G06F 1/3206* (2013.01); *G06F 11/1441* (2013.01);
(Continued)

(58) Field of Classification Search
CPC ............. G06F 12/0873; G06F 12/0871; G06F 1/3206; G06F 12/0895; G06F 12/023; G11C 5/14
See application file for complete search history.

(56) References Cited

U.S. PATENT DOCUMENTS

| 5,974,506 A * | 10/1999 | Sicola ................. G06F 12/0871 711/119 |
| 7,035,987 B2 * | 4/2006 | Rudelic ................. G06F 12/023 711/103 |

(Continued)

*Primary Examiner* — Mark A Giardino, Jr.
(74) *Attorney, Agent, or Firm* — Nixon & Vanderhye PC

(57) ABSTRACT

An apparatus and method are provided for handling caching of persistent data. The apparatus comprises cache storage having a plurality of entries to cache data items associated with memory address in a non-volatile memory. The data items may comprise persistent data items and non-persistent data items. Write back control circuitry is used to control write back of the data items from the cache storage to the non-volatile memory. In addition, cache usage determination circuitry is used to determine, in dependence on information indicative of capacity of a backup energy source, a subset of the plurality of entries to be used to store persistent data items. In response to an event causing the backup energy source to be used, the write back control circuitry is then arranged to initiate write back to the non-volatile memory of the persistent data items cached in the subset of the plurality of entries. By constraining the extent to which the cache storage is allowed to store persistent data items, taking into account the capacity of the backup energy source, the persistence of those data items can then be guaranteed in the event of the backup energy source being triggered, for example due to removal of the primary energy source for the apparatus.

13 Claims, 9 Drawing Sheets

(51) Int. Cl.
*G06F 12/0871* (2016.01)
*G06F 1/3206* (2019.01)
*G06F 12/0895* (2016.01)
*G06F 12/02* (2006.01)
*G11C 5/14* (2006.01)
*G06F 11/14* (2006.01)
*G06F 12/126* (2016.01)
*G06F 12/0868* (2016.01)
*G06F 13/00* (2006.01)
*G06F 13/28* (2006.01)
*G06F 11/20* (2006.01)

(52) U.S. Cl.
CPC ........ *G06F 12/023* (2013.01); *G06F 12/0868* (2013.01); *G06F 12/0871* (2013.01); *G06F 12/0895* (2013.01); *G06F 12/126* (2013.01); *G11C 5/14* (2013.01); *G06F 11/2015* (2013.01); *G06F 2212/1028* (2013.01); *G06F 2212/1032* (2013.01); *G06F 2212/214* (2013.01); *G06F 2212/502* (2013.01)

(56) References Cited

U.S. PATENT DOCUMENTS

| | | | |
|---|---|---|---|
| 2002/0188801 A1* | 12/2002 | Green | G06F 12/0804 711/113 |
| 2007/0005928 A1* | 1/2007 | Trika | G06F 12/0246 711/202 |
| 2013/0036270 A1* | 2/2013 | Dreslinski | G06F 12/0893 711/128 |
| 2016/0179687 A1* | 6/2016 | Kumar | G06F 12/0891 711/135 |
| 2018/0032439 A1* | 2/2018 | Jenne | G06F 12/0891 |

\* cited by examiner

ON ALLOCATION

APPARATUS AND METHOD OF HANDLING CACHING OF PERSISTENT DATA

This application claims priority to GR Patent Application No. 20170100298 filed Jun. 28, 2017, the entire contents of which are hereby incorporated by reference.

BACKGROUND

The present technique relates to an apparatus and method for handling caching of persistent data.

It is known to provide a data processing apparatus with access to a non-volatile memory in which data items on which the data processing apparatus performs data processing operations are stored. Being a non-volatile memory, the content of this non-volatile memory will be persistent after power to the data processing system has been interrupted and restored, whether due to a controlled restart or due to an unexpected event. Accordingly, the non-volatile memory will typically be used to store data that is required to be persistent (referred to herein as persistent data).

However, since non-volatile memory can be used as a cheaper and larger replacement for traditional volatile memory such as DRAM (Dynamic Random Access Memory), it is also the case that non-persistent data may be stored in the non-volatile memory, in order to leverage the large capacity and lower cost of non-volatile memory.

It is also known to provide a data processing apparatus with a cache in which local copies of data items retrieved from memory and being written out to the memory are temporarily stored. This can provide significant performance benefits, but can present problems where that cache is used to store persistent data, due to the fact that the cache storage will not typically be a persistent storage structure.

Accordingly, it would be desirable to provide a mechanism that reliably and efficiently enables persistent data to be cached without compromising the ability to retain that data as persistent data.

SUMMARY

In a first example configuration, there is provided an apparatus comprising: cache storage having a plurality of entries to cache data items associated with memory addresses in a non-volatile memory, the data items comprising persistent data items and non-persistent data items; write back control circuitry to control write back of the data items from the cache storage to the non-volatile memory; and cache usage determination circuitry to determine, in dependence on information indicative of capacity of a backup energy source, a subset of the plurality of entries to be used to store persistent data items; wherein, in response to an event causing the backup energy source to be used, the write back control circuitry is arranged to initiate write back to the non-volatile memory of the persistent data items cached in said subset of the plurality of entries.

In another example configuration there is provided a method of handling caching of persistent data within a cache storage having a plurality of entries to cache data items associated with memory addresses in a non-volatile memory, the data items comprising persistent data items and non-persistent data items, the method comprising: employing write back control circuitry to control write back of the data items from the cache storage to the non-volatile memory; determining, in dependence on information indicative of capacity of a backup energy source, a subset of the plurality of entries to be used to store persistent data items; and in response to an event causing the backup energy source to be used, causing the write back control circuitry to initiate write back to the non-volatile memory of the persistent data items cached in said subset of the plurality of entries.

In a yet further example configuration there is provided an apparatus comprising: cache storage means having a plurality of entries for caching data items associated with memory addresses in a non-volatile memory, the data items comprising persistent data items and non-persistent data items; write back control means for controlling write back of the data items from the cache storage means to the non-volatile memory; and cache usage determination means for determining, in dependence on information indicative of capacity of a backup energy source, a subset of the plurality of entries to be used to store persistent data items; wherein, in response to an event causing the backup energy source to be used, the write back control means for initiating write back to the non-volatile memory of the persistent data items cached in said subset of the plurality of entries.

BRIEF DESCRIPTION OF THE DRAWINGS

The present technique will be described further, by way of example only, with reference to embodiments thereof as illustrated in the accompanying drawings, in which.

DESCRIPTION OF EMBODIMENTS

Figure 1:
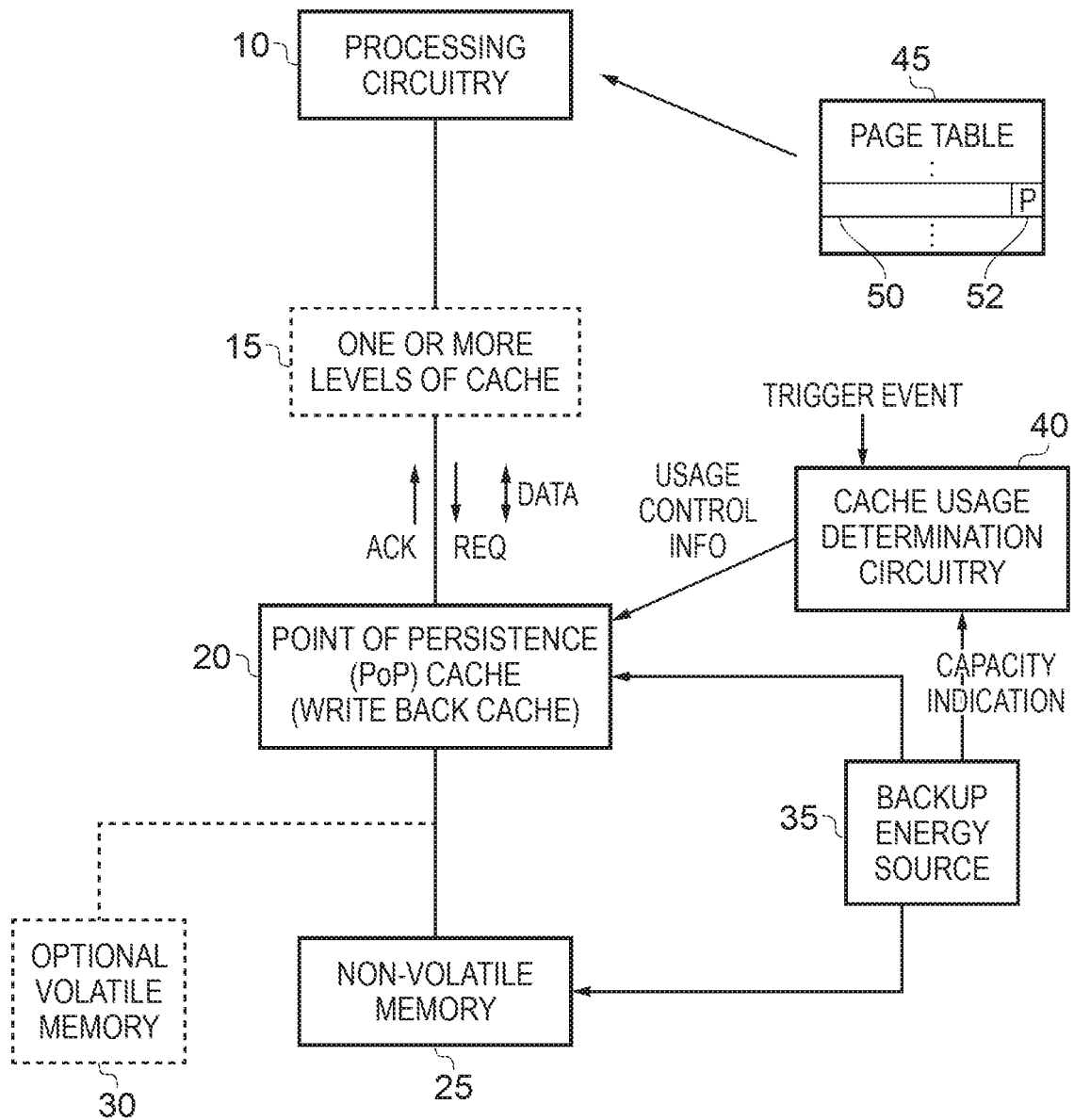
FIG. 1 is a block diagram illustrating a data processing system that incorporates an apparatus in accordance with one embodiment.

Before discussing the embodiments with reference to the accompanying figures, the following description of embodiments is provided.

In accordance with the described embodiments, an apparatus is provided that has cache storage having a plurality of entries to cache data items associated with memory addresses in a non-volatile memory. The data items may comprise persistent data items and non-persistent data items. The entries can take a variety of forms, but in one embodiment each entry comprises a cache line of the cache storage, in which one or more data items may be stored. In one embodiment, any data items stored in a particular cache line will be of one type, and hence will be persistent data items or non-persistent data items. The apparatus further provides write back control circuitry to control write back of the data items from the cache storage to the non-volatile memory. Such a mechanism allows the version of a data item held within the cache storage to be more up to date than a version held in non-volatile memory, and for that more up to date version (often referred to as a dirty data item) to later be written back to non-volatile memory, for example during performance of an eviction process.

The system in which the apparatus is used includes a backup energy source, that can provide backup power to the cache storage and the non-volatile memory under certain conditions, for example in the event of an interruption in the primary source of energy for the apparatus. In accordance with the described embodiments, the apparatus includes cache usage determination circuitry to determine, in dependence on information indicative of capacity of that backup energy source, a subset of the plurality of entries to be used to store persistent data items. By such an approach, the extent to which the cache storage is allowed to be used to store persistent data items can be constrained, taking in to account the capacity of the backup energy source.

Then, in response to an event causing the backup energy source to be used, the write back control circuitry is arranged to initiate write back to the non-volatile memory of the persistent data items cached in the subset of the plurality of entries. By having constrained the number of entries that can be used to store persistent data items taking into account the capacity of the backup energy source, it can hence be ensured that there will be sufficient backup energy available to allow all of the persistent data items that were cached in the cache storage to be written back to the non-volatile memory. Hence, even though the cache storage itself may be non-persistent, it can be considered to be a point of persistence within the system, in that it can be guaranteed that once a persistent data item has been stored in the cache storage, that data item can be maintained in a persistent manner in the event of an interruption in power.

Such an approach also provides additional benefits. For example, the cache storage can be provided with a size that exceeds the number of entries that the backup energy source can guarantee to be able to write back to the non-volatile memory before its capacity is exhausted, and instead persistent data items can be restricted to a subset of the available entries calculated taking into account the capacity of the backup energy source. By providing a larger capacity cache storage, this can provide enhanced performance benefits, for example in relation to caching reads for in-memory applications, and coalescing non-persistent writes to ease wearing of the non-volatile memory. As another benefit, the backup energy source can be made smaller for a given size of cache memory. This can be useful since such energy storage units are usually quite bulky, and the rate of density improvement of such energy storage units typically lags behind that of cache memory (that is often constructed using DRAM technology).

There are a number of ways in which the cache usage determination circuitry may identify the subset of the plurality of entries to be used to store persistent data items. For example, in one embodiment the indication produced by the cache usage determination circuitry may directly identify the actual entries to be used, whilst in an alternative embodiment the indication produced by the cache usage determination circuitry may identify a maximum number of entries to be used to store persistent data items, with additional information then being used to identify the actual entries employed to store persistent data items.

Once the subset has been identified, the apparatus may constrain the way in which data is allocated into the cache so that any persistent data items are stored in that identified subset, whether that persistent data is "dirty" (and hence more up to date than any version of that data held in the non-volatile memory) or not. Alternatively, the use of the subset may be constrained so that persistent data items that will need writing back to the non-volatile memory, i.e. persistent data items that are dirty, will be stored in entries of the identified subset. However, persistent data items that are "clean", and hence are already stored in the non-volatile memory in up-to-date form, may in one embodiment be allowed to be stored in entries of the cache outside of that subset, since they will not need to be written back to the non-volatile memory on occurrence of an event causing the backup energy source to be used.

Whilst in one embodiment, in response to an event that causes the backup energy source to be used, the write back control circuitry may be arranged to order write back operations so that the persistent data items are the first data items to be written back to memory, but to thereafter allow other data items to be written back to memory if capacity is still available in the backup energy source, in an alternative embodiment the write back control circuitry is arranged to prevent write back to the non-volatile memory of the non-persistent data items. Accordingly, this allows the non-persistent data items to be lost in the event of a power failure, rather than written back to the non-volatile memory like persistent pages. This hence can significantly reduce the number of write back operations performed in the event of a power failure, thereby resulting in less energy being needed to handle the write back operations, and less wearing of the non-volatile memory by performing unnecessary write back operations, whilst also enabling faster backup and restore of data. In particular, only the persistent data items are written back, and the non-persistent data items are allowed to be lost, since they are not required to persist in the event of a power failure.

Furthermore, such an approach can help with data security, since it may be required that any non-persistent data is actively erased, or at least protected from being read, in the event of a power off of the device, or the non-volatile memory being removed and plugged in to another machine. In particular, the above approach allows the non-persistent data items merely to be lost by being left within the cache storage and not written back to memory. This reduces the amount of cleaning operations that may be required in respect of the non-volatile memory to remove any non-persistent data items following a power off event.

In one embodiment, the cache usage determination circuitry can be arranged to re-determine the subset of the plurality of entries at certain points in time. For example, the cache usage determination circuitry may be responsive to a trigger event to perform the determination of the subset of the plurality of entries to be used to store persistent data items.

The trigger event can take a variety of forms, for example it can be one or more of: a boot procedure performed on the apparatus; elapse of a chosen time interval since a previous determination of the subset of the plurality of entries to be used to store persistent data items; and an indication received from the backup energy source providing an updated indication of capacity.

By such an approach, the appropriate number of entries to allow to be used for storing persistent data items can be re-evaluated over time, to take into account the current capacity of the backup energy source. Hence, by such an approach, it is possible to reduce the number of entries used to store persistent data items as the capacity of the backup energy source deteriorates over time, so as to ensure that the cache storage can continue to be a guaranteed point of persistence within the system.

In one embodiment, the apparatus further comprises allocation circuitry that is responsive to a request from a request source to allocate a new data item into the cache storage, on allocating said new data item into the cache storage when the new data item is a persistent data item, the allocation circuitry being arranged to issue an acknowledgement signal to the request source that confirms persistence of the new data item. Due to the fact that the maximum number of entries within the cache storage that are allowed to be used to store persistent data items is controlled based on the capacity of the backup energy source, once a new persistent data item has been allocated into the cache, it can be guaranteed that the data item will persist, and accordingly the acknowledgement signal can confirm that persistence to the request source.

There are a number of ways in which the write back control circuitry can determine which entries contain persistent data items. In one embodiment, the apparatus further comprises control storage to store usage control information used to identify the subset of the plurality of entries to be used to store persistent data items. Then, in response to an event causing the backup energy source to be used, the write back control circuitry is arranged to reference the control storage in order to determine which entries are to have their data items written back to the non-volatile memory.

In particular, by referencing the control storage, the write back control circuitry can limit its activities to the subset of the entries identified using the usage control information. It will be appreciated that not all of the entries identified by the usage control information may in fact need to have their content written back to non-volatile memory since one or more of those entries may not at that point in time contain valid persistent data items that are dirty. However, the subset of entries identified by the usage control information represents the maximum number of entries that may store persistent data items, and hence when ensuring the persistent data items are backed up to the non-volatile memory upon use of the backup energy source, the write back control circuitry only needs to consider that subset of entries.

The usage control information can take a variety of forms. In one embodiment, the cache storage is partitioned (at least logically) into a persistent region and a non-persistent region, and the usage control information enables identification of the persistent region. In one particular embodiment, the usage control information identifies a borderline address between the persistent region and the non-persistent region.

It will be appreciated that in one embodiment the view of the cache storage as being partitioned into a persistent region and a non-persistent region is a logical view, and the persistent region need not be a discrete single physical region made up of contiguous cache entries. Indeed, in one embodiment the subset of the plurality of entries forming the persistent region comprises one or more of: a sequence of contiguous entries within the cache storage; a plurality of non-contiguous entries within the cache storage; and/or a sequence of entries interleaved with entries forming the non-persistent region.

In one embodiment, the content of each cache entry will have an associated memory address and analysis of at least a portion of that memory address can be used to determine whether that entry is considered to be within the persistent region or the non-persistent region. Alternatively, one or more ways within an N-way set associative cache may be reserved for the storage of persistent data items.

In a yet further alternative embodiment, the cache may comprise a dedicated physical structure for the storage of persistent data items that are more up to date than the version held in non-volatile memory, with that separate structure having a number of entries equal to the maximum number of entries than can be written back to non-volatile memory, having regard to the capacity of the backup energy source. As the capacity of the backup energy source reduces over time, one or more of those entries in that dedicated resource can be blocked from further use so as to ensure that it continues to be the case that the number of entries to be used to store such persistent data items takes into account the current capacity of the backup energy source.

In an alternative embodiment, the usage control information identifies a maximum number of entries that are to be used to store persistent data items, and this information is used in combination with some additional information to identify the particular entries that are storing persistent data items.

For example, in one embodiment, each entry within the cache storage has a persistence indication associated therewith that is set to identify that that entry stores persistent data. The apparatus may then further comprise check circuitry to ensure that at any point in time the number of entries used to store persistent data is less than or equal to said maximum number.

As an alternative, the apparatus may further comprise entry identification storage to maintain identifier information for each entry within the cache storage which stores persistent data. Again, check circuitry may then be used to ensure that at any point in time the number of entries used to store persistent data is less than or equal to the maximum number.

The identifier information can take a variety of forms, but in one embodiment comprises a pointer value used to identify an associated entry within the cache storage. Hence, in accordance with this latter embodiment, rather than each individual entry maintaining a persistence indication to identify whether its contents are persistent data or not, a separate set of pointers can be maintained to identify the entries within the cache storage which do store persistent data.

In one embodiment, the allocation circuitry that responds to a request that causes a new data item to be allocated in the cache storage, may be used to reference the control storage when determining into which cache entry the new data item is to be allocated. By such an approach, when the new data item is a persistent data item, that new data item will be allocated into an entry within the subset of a plurality of entries as identified by the control storage.

There are a number of ways in which the allocation circuitry can determine whether the data to be allocated is persistent data or non-persistent data. In one embodiment the request provides type information indicating whether the new data item is a persistent data item or a non-persistent data item, and accordingly the allocation circuitry can refer directly to that type information.

In one example embodiment, the apparatus further comprises one or more page tables providing attributes for pages in the non-volatile memory, wherein for each page said attributes comprise a type attribute identifying whether data items within that page are persistent data items or non-persistent data items, and said type attribute is provided in association with the request. Hence, the persistent or non-persistent nature of data is specified on a memory page by memory page basis, and the information extracted with reference to the page table(s) may be associated with each request so that it is clear to the allocation circuitry whether the data to be allocated is persistent data or non-persistent data.

In one embodiment, there may be one or more intervening levels of cache between the cache storage and processing circuitry. In one particular embodiment, for persistent data output by the processing circuitry for storage in the cache storage, the type attribute information is used to cause the one or more intervening levels of cache to operate in a write through mode for the persistent data. By such an approach, it can be ensured that when a write operation is performed by the processing circuitry to write an item of persistent data, that item of persistent data will be passed to the cache storage without delay, even if it is cached in one or more intervening levels of cache. As a result, it will be stored within the point of persistence cache storage, and hence at that point can be guaranteed to be treated as persistent by the apparatus. In particular, once the item of persistent data has been stored in the cache storage, it can be guaranteed that it can be maintained in a persistent manner in the event of power being removed.

In one embodiment, the non-volatile memory may comprise, in addition to non-volatile storage, a volatile storage to be coupled to the backup energy source and to operate as a region of addressable non-volatile memory. In response to an event causing the backup energy source to be used, at least dirty persistent data stored in the volatile storage may then be copied to the non-volatile storage to ensure the persistence of that data. Such an approach can allow for faster access times in some embodiments, as volatile storage (e.g. DRAM) may typically be faster to access than non-volatile storage. It can also enable a reduction in the size of the non-volatile storage.

Particular embodiments will now be described with reference to the Figures.

FIG. 1 is a block diagram of a system in accordance with one embodiment. Processing circuitry 10 is provided for executing instructions in order to perform data processing operation on data items. The data items are stored within memory that comprises non-volatile memory 25, and which may optionally include other memory such as the volatile memory 30. Due to the nature of the non-volatile memory, data held within the non-volatile memory will be persistent in the event of an interruption in the energy supply, and hence the non-volatile memory will typically be used to store data that is required to be persistent (referred to herein as persistent data). Whilst non-persistent data can be stored in other parts of the memory system if such other memory components are provided, for example the volatile memory 30, as the size of non-volatile memory increases and its cost reduces, it is becoming more common for the non-volatile memory to also be used to store non-persistent data.

The non-volatile memory can take a variety of forms, and in particular there are a number of memory technologies that provide non-volatile memory structures. Some examples are phase change memory (PCM), spin torque transfer magnetic random access memory (STT-MRAM), correlated electron random access memory (CeRAM), NAND or NOR Flash memory, resistive random access memory (ReRAM), etc.

A cache system may typically be used that is interposed between the processing circuitry and the memory system, and may include one or more levels of cache, including the optional levels 15 shown in FIG. 1, and the cache 20. As will be discussed in more detail herein, the cache 20 is managed so that it can act as a point of persistence (PoP) for persistent data that needs writing to the non-volatile memory 25.

As shown in FIG. 1, a backup energy source 35 may be provided for providing backup energy to at least the cache 20 and the non-volatile memory 25 for a period of time following interruption in the main energy source. Hence, when the main energy source for the system is removed, either intentionally or unintentionally, the backup energy source 35 can be triggered to provide backup energy to the cache 20 and the non-volatile memory 25. As will be discussed herein, the capacity available from the backup energy source can be used to ensure that persistent data that is held within the cache 20, and that is not currently replicated in the non-volatile memory 25, can be written back to the non-volatile memory 25 to ensure that the persistent data is retained in a persistent form.

However, the extent to which the cache 20 can be used to store persistent data that has yet to be written back to the non-volatile memory 25 is constrained to take into account the capacity of the backup energy source 35. In particular, in one embodiment cache usage determination circuitry 40 can be provided that is arranged to received capacity indication information from the backup energy source 35 indicative of the capacity of that backup energy source. In response to one or more trigger events, the cache usage determination circuitry is arranged to use the most recent capacity indication received from the backup energy source to determine a subset of the entries within the cache 20 that are allowed to be used to store persistent data. As will be discussed in more detail later, as a result of the determination performed by the cache usage determination circuitry, usage control information is provided to the cache 20 to identify the subset of entries that can be used to store persistent data items. This usage control information may in one embodiment directly identify the entries that are to be used to store such persistent data, or alternatively can indicate a maximum number of entries that can be used to store such persistent data, with additional information then being retained by the cache to identify the actual entries that are used to store persistent data.

In one embodiment, the cache may be arranged so that any persistent data to be stored in the cache is constrained to be allocated within the subset of entries determined from the usage control information, irrespective of whether that persistent data is dirty (i.e. more up to data than any copy held in the non-volatile memory 25), or is clean (i.e. the copy in non-volatile memory is currently up to date). Such an approach has the simplicity that all persistent data is treated in the same way, and is constrained to be allocated into the subset of entries determined from the usage control information. However, in an alternative embodiment, the allocation scheme can be relaxed somewhat, so that persistent data items that are clean are not constrained to be allocated into the subset of entries identified using the usage control information. However, all dirty persistent data will be constrained to be allocated into that subset. Since clean persistent data will in any event be persistent at the point a main energy source is removed, there is no need to write that clean persistent data back to the non-volatile memory. Instead, it is only the dirty persistent data that needs to be written back on interruption of the main energy source, and by constraining the number of entries within the cache that can be used to store dirty persistent data, taking into account the capacity of the backup energy source 35, it can hence be ensured that there is sufficient capacity within the backup energy source to fully write back to the non-volatile memory any dirty persistent data present within the cache 20 at the time of an interruption in the main energy source.

If clean persistent data is allowed to be allocated into a cache entry outside of the identified subset of entries, then in one embodiment the cache keeps track of that persistent data, so that if any operations performed by the processing circuitry 10 result in the content of that cache entry being updated so that it then represents dirty persistent data, the presence of that dirty persistent data is then taken into account when ensuring that the total amount of dirty persistent data within the cache 20 does not exceed the maximum allowable amount, having regards to the capacity of the backup energy source 35.

The cache usage determination circuitry 40 can be arranged to re-evaluate the subset of entries to be used to store persistent data items on occurrence of one or more trigger events. The trigger events can take a variety of forms. For example, one trigger event may be the initiation of a boot procedure on the system. At boot time, capacity indication information from the backup energy source 35 will then be used by the cache usage determination circuitry 40 to determine the subset of entries to be used to store persistent data items. As the system ages, the capacity of the backup energy source is likely to deteriorate, and such a process ensures that each time the system is rebooted, the extent to which the cache 20 can be used to store persistent data is re-evaluated taking into account the current capacity of the backup energy source.

Instead, or in addition, elapse of a chosen time interval may be used to initiate the trigger event, so that the re-evaluation is performed by the cache usage determination circuitry at periodic intervals, for example after the elapse of a certain time interval since the last determination was performed. In addition, or alternatively, the cache usage determination circuitry may be triggered by receipt of an updated capacity indication from the backup energy source 35, to perform the re-evaluation of the subset of entries to be used to store persistent data items.

In one embodiment the cache usage determination circuitry 40 may be dedicated circuitry associated with the cache 20 for evaluating the capacity indication information and outputting appropriate usage control information to the cache. Alternatively, the circuitry 40 may be implemented by software executing on the processing circuitry 10 in order to periodically compute the usage control information and output that usage control information to the cache 20.

When the cache 20 receives a request to allocate data into one of its cache entries (in one embodiment, each cache entry is a cache line of the cache), then there are a number of ways in which the cache can determine whether the data to be allocated into a cache entry is persistent data or non-persistent data. In one embodiment, the processing circuitry 10 has access to one or more page tables 45 (which in one example can be stored in memory), the page tables 45 having a number of entries 50 for storing address translation information for associated pages in memory, for example to enable virtual addresses specified by the processing circuitry to be translated into physical addresses within the memory system. Such page table entries can also store associated attributes of the pages in memory, and in one embodiment each entry includes a persistence bit identifying whether the data stored within that page in memory is persistent data or non-persistent data. In such embodiments, that information extracted from the page table can be forwarded in association with each request to identify whether that request relates to persistent data or non-persistent data. The cache 20 can then use that information provided in association with the request to decide whether the data needs to be allocated into the subset of entries reserved for persistent data or not.

The page tables may for example be managed by the operating system, with the operating system memory manager knowing which pages store persistent data. If the point of persistence cache 20 is managed by the operating system, the operating system would have full knowledge from the persistence bit 52 whether the data to be allocated is persistent data or not. If instead the point of persistence cache is managed by a user application, the user application will have full knowledge of which pages are allocated as persistent, such as caches managed by database applications. If instead the point of persistence cache is managed by a hardware controller, then the cache controller will be arranged to interpret the persistence information provided in association with the request, in much the same way as it interprets information identifying whether the data is cacheable or not.

Since the number of entries within the cache 20 used to store persistent data is constrained taking into account the capacity of the backup energy source, once a write request from the processing circuitry 10 has resulted in the cache 20 allocating persistent write data into a cache line, it can at that point be guaranteed that the persistent data will be maintained in a persistent manner, even though it has not yet been written back to the non-volatile memory, and accordingly the acknowledgement issued by the cache 20 can confirm the persistence of that data. Accordingly, the cache 20 can be viewed as a point of persistence within the system, since the dirty persistent data held therein can be guaranteed to be written back to the non-volatile memory 25 in the event of an interruption in power supply to the system, through use of the backup energy source 35.

As mentioned earlier, there may be one or more intervening levels of cache 15 between the point of persistence cache 20 and the processing circuitry 10. Whilst these intervening levels of cache may operate in a write through or a write back mode of operation, in one particular embodiment when a request is output from the processing circuitry specifying persistent data to be written to memory, the identification of that write data as being persistent data can be arranged to cause those intervening levels of cache to operate in a write through mode, such that irrespective of whether those one or more levels of cache do in fact cache the data, that data is propagated on without delay to the point of persistence cache 20, where it can then be allocated into a cache line, at which point persistence can be guaranteed.

It will be appreciated that in further embodiments one or more of the other levels of cache 15 may also have access to the backup energy source 35 in the event of an interruption in the power supply, and in that event any one of those additional caches could also be arranged as a point of persistence cache if desired. The cache usage determination circuitry 40 could then determine the number of entries that each point of persistence cache could use to store persistent data so that the total number of entries allowed to be used collectively by the multiple point of persistence caches is chosen to take into account the overall capacity of the backup energy source 35. For example, in one embodiment each level 1 data cache can be provided with a persistent write buffer that is guaranteed to drain all its entries to non-volatile memory in the event of a power failure.

By constraining how the point of persistence cache 20 is used, and in particular the extent to which its cache lines can be used to store persistent data items taking into account the capacity of the backup energy source, this can give rise to a number of benefits. Firstly, the size of the cache 20 can be made significantly larger than would be possible were no constraints placed on the storage of persistent data within that cache, since without the constraints placed upon the cache 20 via the cache usage determination circuitry 40, it would have to be assumed that all of the entries might store persistent data, and accordingly the size of the cache would be constrained by the capacity of the backup energy source. However, through use of the above described technique, the overall size of the cache is not constrained in that way, and accordingly a much larger cache can be provided. Instead, the above described technique provides a capacity-limited point of persistence, by ensuring that dirty persistent data items stored within the cache are restricted to a subset of the cache lines, where that subset is determined having regards to the current capacity of the backup energy source.

By enabling the size of the cache 20 to be increased, this can assist with achieving various performance benefits, for example with caching read data for in-memory applications, and/or allowing coalescing of non-persistent write data in order to ease wearing of the non-volatile memory by reducing the total number of write operations performed to the non-volatile memory. These benefits can be achieved, whilst still maintaining persistence for persistent data held within the cache.

As another benefit, the backup energy source can be made smaller for a given size of cache memory. This can be useful since such energy storage units are usually quite bulky, and the rate of density improvement of such energy storage units typically lags behind that of cache memory (that is often constructed using DRAM technology).

In one embodiment, when the backup energy source is triggered following the interruption in a power supply, write back circuitry within the cache 20 will ensure that any dirty persistent data is written back to the non-volatile memory. However, in one embodiment no write back will be performed in respect of dirty non-persistent data, and instead the non-persistent data will be allowed to be lost in those circumstances. This reduces the total number of write back operations required on a power failure, as volatile data does not need to be persisted from the cache to the non-volatile memory. This results in less energy being required by the backup energy source 35, and less wearing of the non-volatile memory, whilst also providing for faster backup and restore operations.

Furthermore, such an approach can help with data security, as it is possible that any data held in the non-volatile memory 25 that is associated with volatile pages may need to be erased, or at least protected from being read, following a power off of the apparatus, or the non-volatile memory module being plugged into another machine, and the above approach taken in respect of the cache 20 will have reduced the amount of non-persistent data that might otherwise need to be subjected to cleaning operations within the non-volatile memory 25 in such situations.

Figure 2:
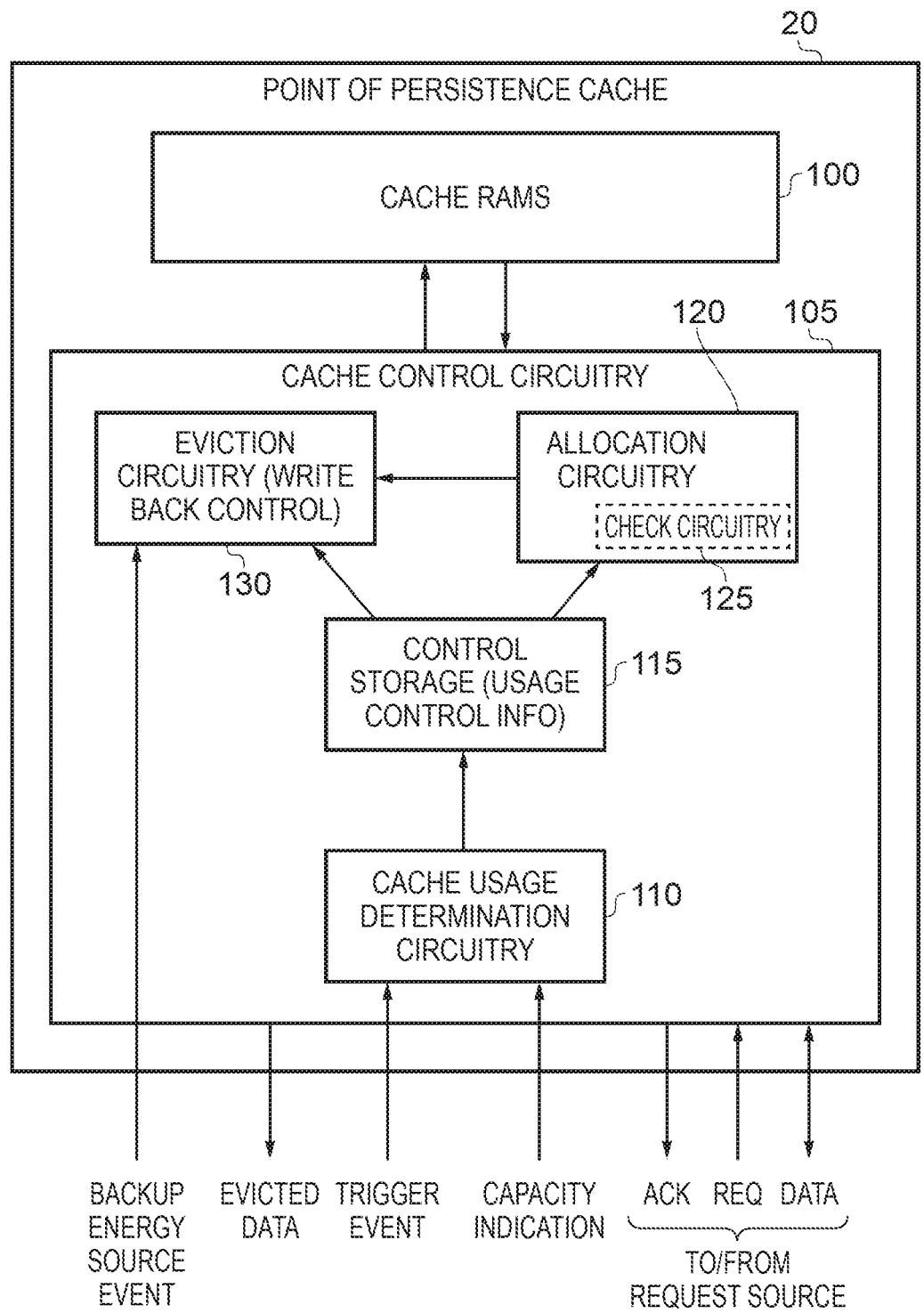
FIG. 2 is a diagram illustrating in more detail components provided within the point of persistence cache of FIG. 1 in accordance with one embodiment.

FIG. 2 is a block diagram illustrating more detail of components provided within the point of persistence cache 20 of FIG. 1 in accordance with one embodiment. Cache RAMs 100 are provided, which in one embodiment may be arranged in an N-way set associative manner, as will be well understood by those skilled in the art. In association with each cache line in a data RAM, a corresponding entry may be provided in a tag RAM to identify certain address information for the data held in the corresponding cache line, along with certain control information, for example to identify whether the content of the cache line is valid, whether it is dirty, etc.

Cache control circuitry 105 is used to control access to the cache RAMs 100, and may be considered to comprise allocation circuitry 120 for allocating data received in association with a write request, so that that data is stored within one of the cache lines. For a read request, lookup circuitry (not separately shown within the cache control circuitry 105) can be used to perform a lookup operation in the cache RAMs in order to determine whether the requested data is present within the cache or not, and if so the requested data can be returned to the request source. However, in the event of a cache miss, the request can be propagated on to the memory system in order to retrieve the data from memory, for return to the request source (for example the processing circuitry 10). Such data retrieved from memory in the event of a cache miss may in one embodiment also be allocated into the cache RAMs 100 as it is returned to the processing circuitry 10, so that that data will then result in a cache hit if a subsequent access is performed.

Eviction circuitry 130 is also provided, which in one embodiment can be considered to include write back control circuitry for writing back data items from the cache to the memory system on occurrence of certain events. These events may include general cache maintenance operations that cause older data to be evicted from the cache RAMs in order to free up space, or may include specific eviction operations initiated by the allocation circuitry, when the allocation circuitry determines that a cache line's current contents needs to be evicted in order to make space for new data to be allocated into that cache line. Further, when an interruption in power causes the backup energy source 35 to be applied, the eviction circuitry 130 will then be used to identify the cache lines storing persistent data items, and any valid and dirty persistent data within the identified cache lines will be evicted back to non-volatile memory 25.

As shown in FIG. 2, in one embodiment the cache control circuitry 105 may incorporate cache usage determination circuitry 110, which implements the functionality of the cache usage determination circuitry 40 shown in FIG. 1, and hence in response to a trigger event uses a current capacity indication from the backup energy source to identify the maximum extent to which the cache should be used to store persistent data items, and to then output usage control information providing an indication of the subset of the entries to be used to store persistent data. In one embodiment, that usage control information is stored within the control storage 115, which is then accessible by both the allocation circuitry 120 and the eviction circuitry 130.

When the allocation circuitry 120 determines that a write request has been received requiring persistent write data to be allocated into a cache line within the cache RAMs 100, check circuitry 125 (which can be considered to form part of the allocation circuitry 120) is arranged to reference the control storage 115 (and potentially other related information such as the counter information that will be described later with reference to FIGS. 6A and 7) in order to determine whether there is currently availability to store another cache line of persistent data within the cache, taking into account the constraints indicated by the usage control information. If so, then the allocation circuitry 120 can merely proceed to allocate an available cache line to store that new persistent data. However, otherwise, the allocation circuitry may send a signal to the eviction circuitry 130 to cause at least one cache line currently storing persistent data to be evicted.

Whilst if a cache line's contents are both valid and dirty, the eviction process performed by the eviction circuitry will require the contents of the cache line to be output to non-volatile memory, if an identified cache line has contents which are not dirty, the eviction circuitry may merely need to invalidate the cache line contents, and will not be required to output any data to the non-volatile memory.

Figure 3:
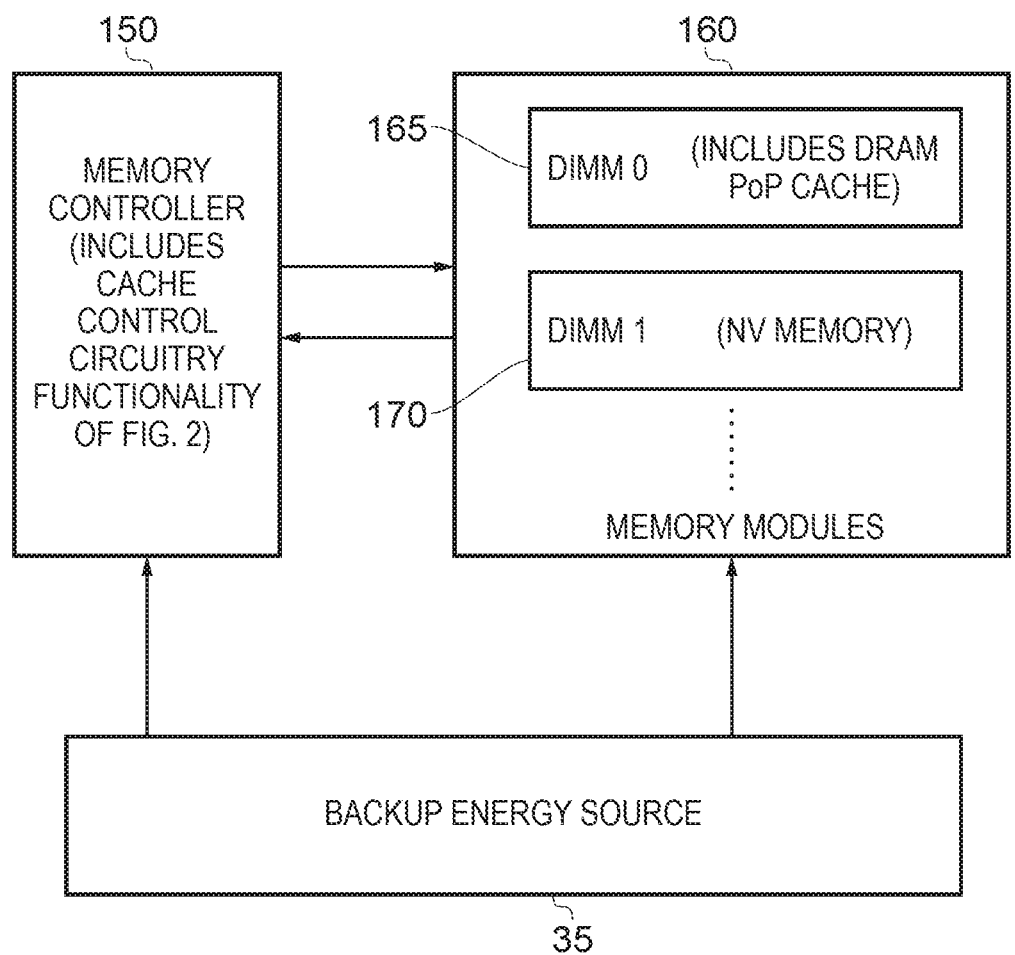
FIG. 3 schematically illustrates an embodiment where the point of persistence cache is incorporated within the memory modules managed by an associated memory controller, in accordance with one embodiment.

Whilst in one embodiment the point of persistence cache 20 may be entirely separate to the memory system, as shown in FIG. 3 in an alternative embodiment the point of persistence cache may actually be provided by a memory module within a set of memory modules controlled by an associated memory controller. In particular, a set of memory modules 160 may be provided, which may in one embodiment comprise a plurality of plug-in memory modules such as dual inline memory modules (DIMMs). The individual DIMMs 165, 170 may include non-volatile memory, and indeed volatile memory such as the optional volatile memory 30 shown in FIG. 1. In addition, one of the DIMMs 165 may include a PoP cache, for example a DRAM cache. Each of the DIMMs 165, 170 can be controlled by a memory controller 150, and in situations where one of the DIMMs includes the PoP cache, the memory controller may include the cache control circuitry functionality discussed earlier with reference to FIG. 2. In such an arrangement, both the memory controller 150 and the various memory modules 160 will have access to the backup energy source 35, so that in the event of an interruption in the primary power source, the persistent data from the PoP cache within the DIMM 165 can be written back to the non-volatile memory within the DIMM 170.

Figure 4:
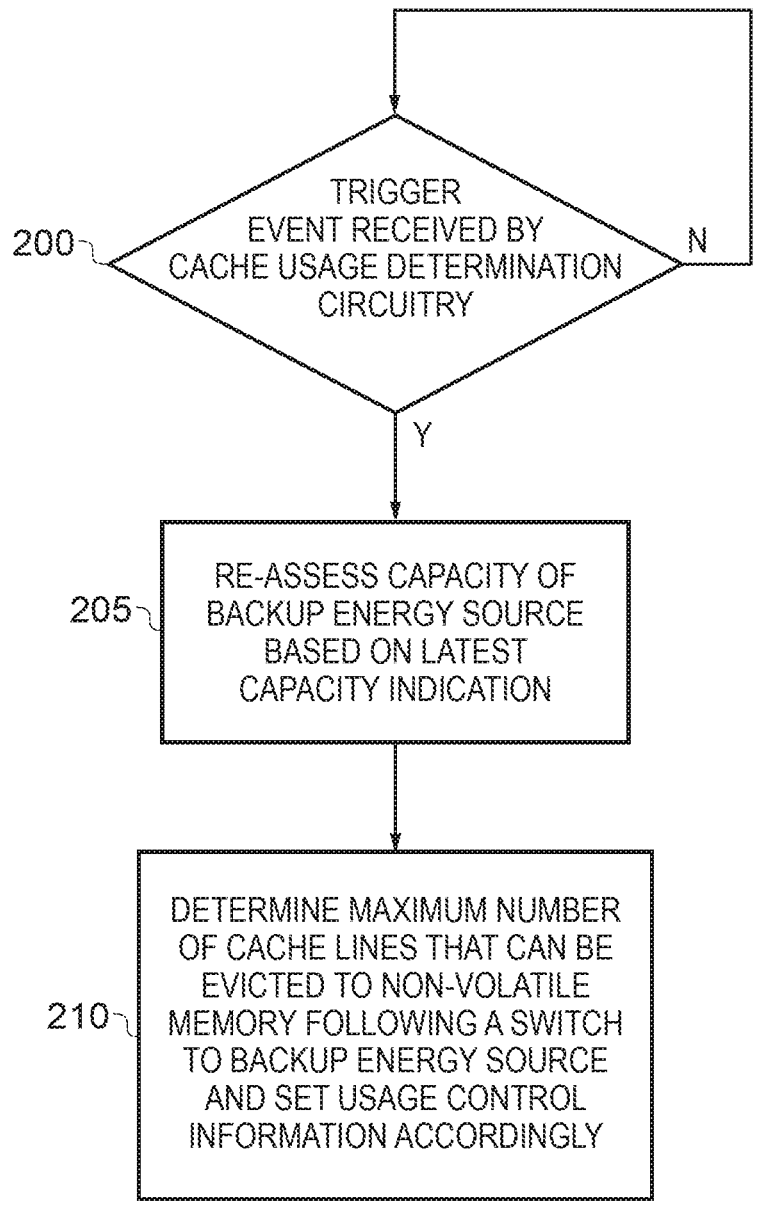
FIG. 4 is a flow diagram illustrating the operation of the cache usage determination circuitry of FIG. 1 in accordance with one embodiment.

FIG. 4 is a flow diagram illustrating the steps performed by the cache usage determination circuitry 40, 110 in accordance with one embodiment. At step 200, it is determined whether a trigger event has been received by the cache usage determination circuitry, and if so then at step 205 the cache usage determination circuitry reassesses the capacity of the backup energy source based on the latest capacity indication information. Then, at step 210 the cache usage determination circuitry determines the maximum number of cache lines that can be evicted to non-volatile memory following a switch to the backup energy source, and sets the usage control information accordingly. As discussed earlier, that usage control information may directly identify the actual cache lines that are to be used to store persistent data, or may identify a maximum number of entries that can be used for storing persistent data, but leaving the cache to keep track of which entries are actually used for that purpose. In one embodiment, the maximum number of entries determined at step 210 may be chosen to take into account an expected decline in capacity of the backup energy source during the interval before the next expected trigger event.

Figure 5A:
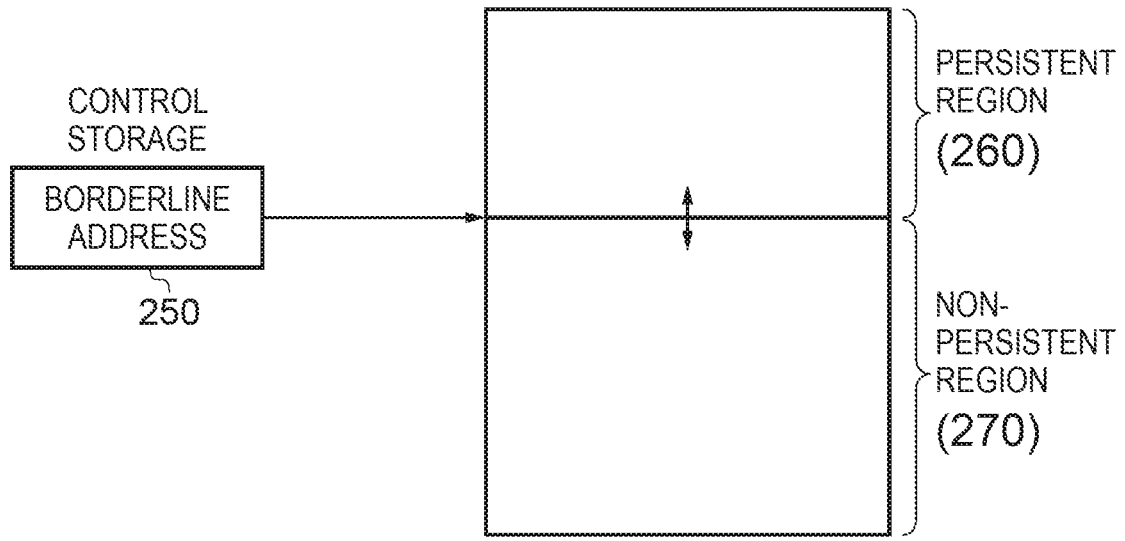
FIG. 5A schematically illustrates a form of usage control information that may be provided in one embodiment.

FIG. 5A schematically illustrates one form of usage control information that may be output by the cache usage determination circuitry. In this embodiment, the usage control information takes the form of a borderline address indication 250 (or threshold indication) identifying a separation between a persistent region 260 and a non-persistent region 270. Hence, in this arrangement, the cache storage is logically considered to consist of a persistent region and a non-persistent region. It will however be appreciated that FIG. 5A only shows a logical view of the cache memory, and in practice the actual cache lines contained within the persistent region 260 and the cache lines contained within the non-persistent region 270 may be dispersed within the cache storage structure. For example, the various cache lines making up the persistent region 260 may comprise a sequence of contiguous cache lines, a plurality of non-contiguous cache lines, and/or a sequence of cache lines interleaved with cache lines from the non-persistent region.

As mentioned earlier, the data stored in each cache line will have an associated memory address, and in one embodiment analysis of at least a portion of that memory address can be used to determine, with reference to the borderline address/threshold address, whether that cache line is considered to be within the persistent region or the non-persistent region. As will be appreciated by those skilled in the art, in certain cache structures, such as N-way set associative caches, only entries within a particular set can be used to store data from a particular memory address range, and accordingly it may be that the cache lines forming the persistent region are spread across a number of sets within the cache structure.

In an alternative embodiment, it may be possible to specify the borderline address information 250 so that that information does not relate directly to memory addresses, but instead enables identification of a particular part of the cache to be used to form the persistent region. For example, it may be that one or more ways within an N-way set associative cache could be reserved for the storing of persistent data via such an approach. Alternatively, the cache may include a dedicated buffer for the storing of persistent write data, i.e. dirty persistent data, with the borderline address information 250 being used to identify that write buffer. In this latter arrangement, it may be allowed that persistent read data, i.e. data that has just been read from the non-volatile memory, and accordingly is still clean, can be allocated within the non-persistent region 270 of the cache, since whilst that data remains clean, it will not need to be subjected to a write back operation upon an interrupt in the power supply.

Figure 5B:
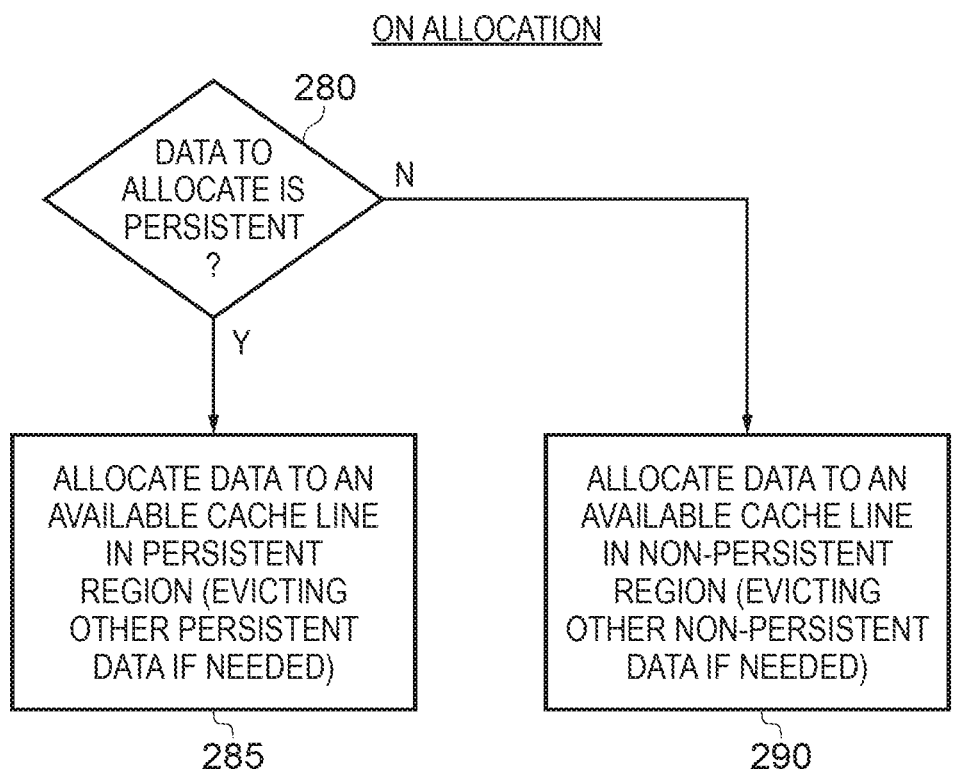
FIGS. 5B and 5C illustrate the data allocation process and backup power triggered eviction process performed in one embodiment when using the FIG. 5A scheme.

FIG. 5B is a flow diagram illustrating a data allocation process that may be performed when adopting the scheme of FIG. 5A. At step 280, it is determined whether the data to be allocated is persistent data or not. As mentioned earlier, this can in one embodiment be derived from data provided as part of the request, for example derived from the persistence bit within the relevant page table entry.

If the data to be allocated is persistent, then the process proceeds to step 285 where the allocation circuitry 120 allocates the data into an available cache line within the persistent region 260 of the cache. As discussed earlier with reference to FIG. 2, this may involve using the eviction circuitry to evict other persistent data if needed in order to free up space for the allocation of the new persistent data, in order to ensure that the total number of cache lines used to store persistent data does not exceed that indicated by the usage control information.

If it is determined at step 280 that the data to allocate is not persistent, then the process proceeds to step 290, where data is allocated to an available cache line in the non-persistent region 270. Again, the eviction circuitry 130 may be used if needed to evict other data from the cache if necessary, in order to free up space for the new allocation of data.

Figure 5C:
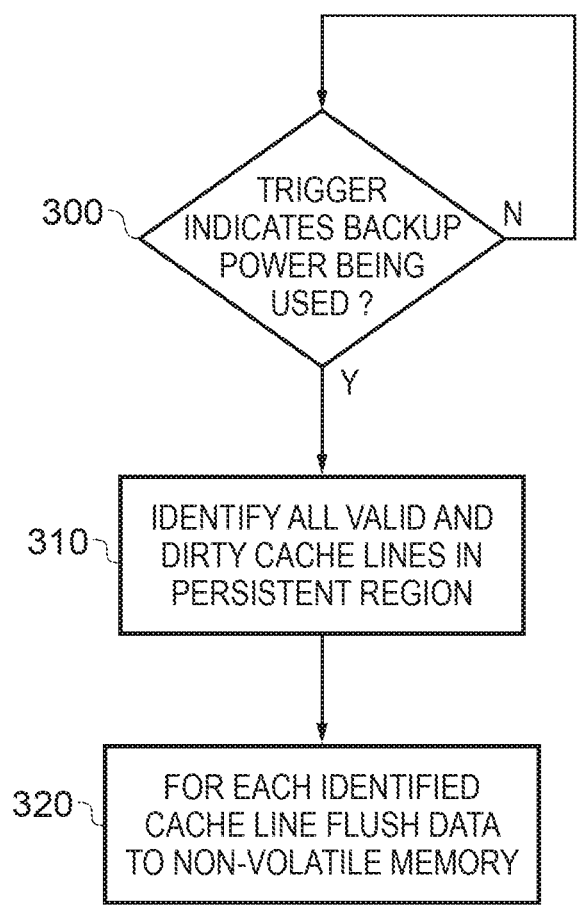

FIG. 5C is a flow diagram illustrating the steps performed as a result of backup power triggered eviction, when adopting the scheme of FIG. 5A. At step 300, it is determined whether a trigger indicates that backup power is being used. As soon as it is determined that backup power has been triggered, then the process proceeds to step 310, where all valid and dirty cache lines in the persistent region 260 are identified. Then, at step 320, for each identified cache line, the data in that cache line is flushed to non-volatile memory using the energy provided by the backup energy source 35.

Figure 6A:
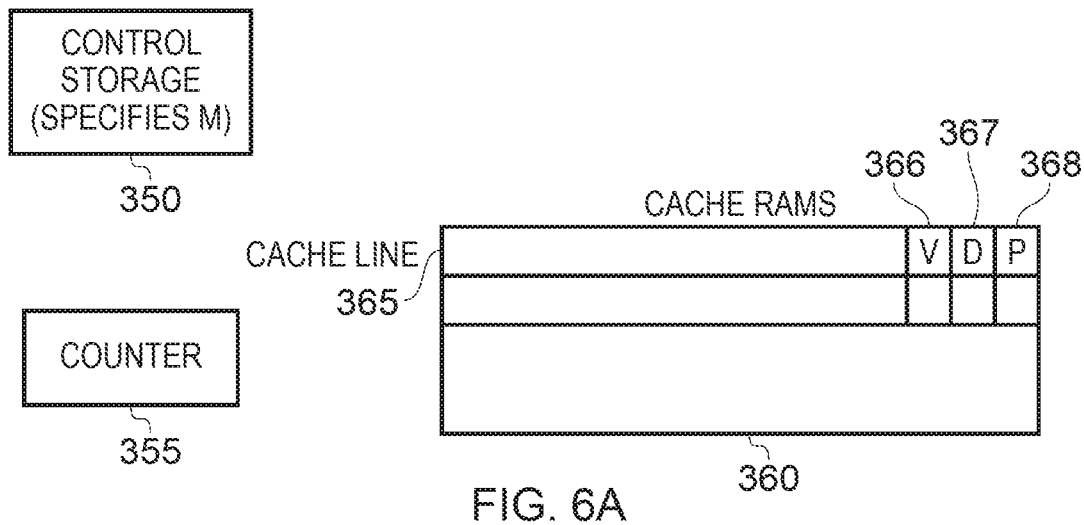
FIG. 6A illustrates a mechanism used in an alternative embodiment to identify the cache lines containing persistent data.

FIG. 6A illustrates an embodiment where the control usage information does not directly identify the cache lines forming the persistent region, but instead specifies a maximum number of entries M that may be used to store persistent data. Accordingly, this maximum number information is stored within the control storage 350, and in addition a counter 355 is maintained by the cache to keep track of the number of cache lines that have been allocated for storing persistent data.

As shown in FIG. 6A, the cache RAMs 360 include cache lines 365 along with associated control information (which may in one embodiment be stored in a separate tag RAM entry but for simplicity is shown as part of the cache line 365 in FIG. 6A). The control information can in one embodiment include a valid bit 366 to identify whether the data held in the cache line is valid, and a dirty bit 367 to identify whether the contents of the cache line are dirty. In one embodiment, the control information additionally includes a persistence (P) bit 368 whose value indicates whether the data in the cache line is persistent data or non-persistent data. In one embodiment, each time persistent data is allocated into a cache line, and accordingly the associated persistence bit 368 is set, the counter 355 is incremented. Conversely, each time such a cache line is evicted from the cache, the counter is decremented. During each allocation process, the counter is reviewed, in order to ensure that the maximum number of entries M as indicated by the contents of the control storage 350 will not be exceeded when new persistent data is allocated into the cache.

Figure 6B:
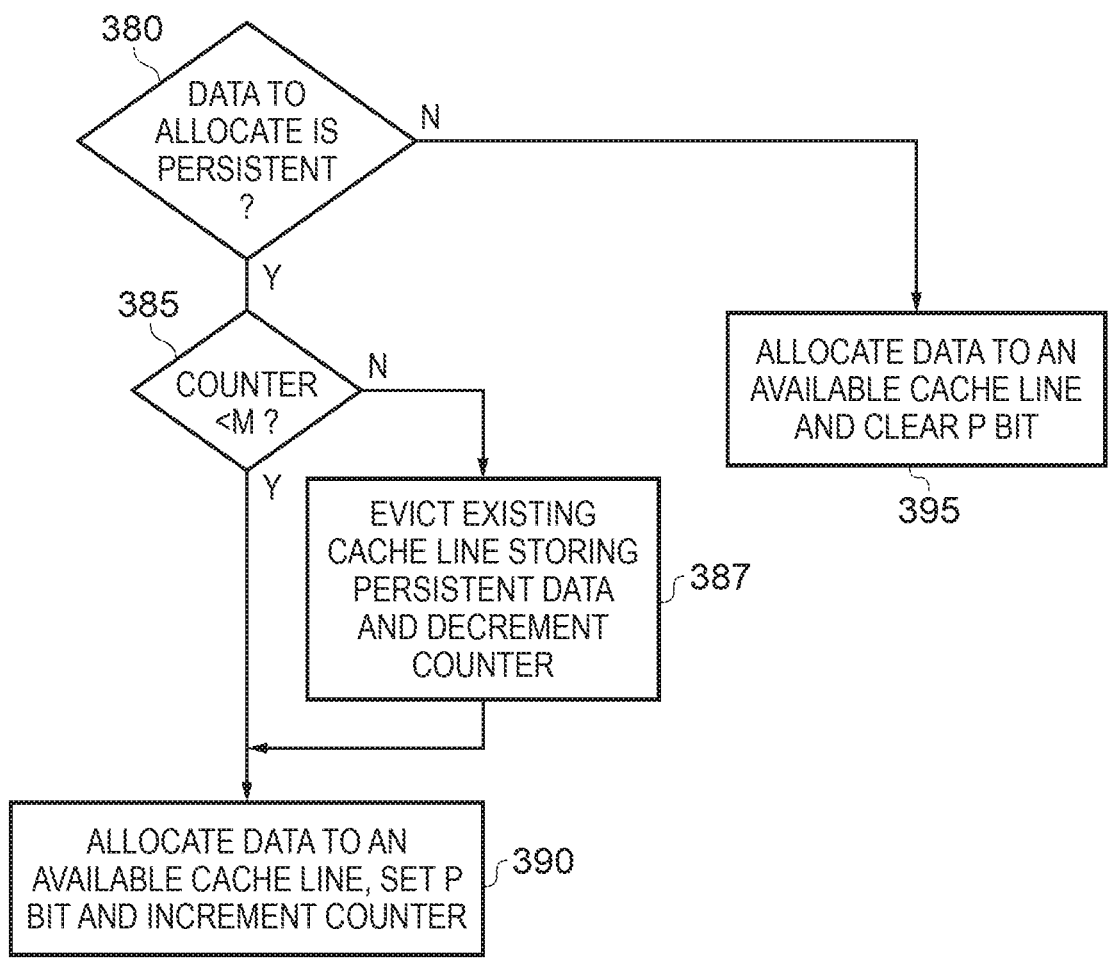
FIGS. 6B and 6C illustrate the allocation process and backup power triggered eviction process that may be performed when adopting the scheme of FIG. 6A.

This allocation process is illustrated in more detail by the flow diagram of FIG. 6B. In particular, at step 380 it is determined whether the data to be allocated into the cache is persistent data. If not, the process merely proceeds to step 395 where the data is allocated to an available cache line, and the P bit is cleared.

However, if the data to be allocated is persistent, it is determined whether the counter is less than the maximum value M. If it is, then the process proceeds to step 390 where the data is allocated to an available cache line, the P bit is set, and the counter is incremented. However, if the counter is currently at the maximum value M, then instead the process proceeds to step 387, where an existing cache line storing persistent data is evicted, and the counter is decremented. Thereafter, the process can proceed to step 390 to allow new data to be allocated into the cache line.

Figure 6C:
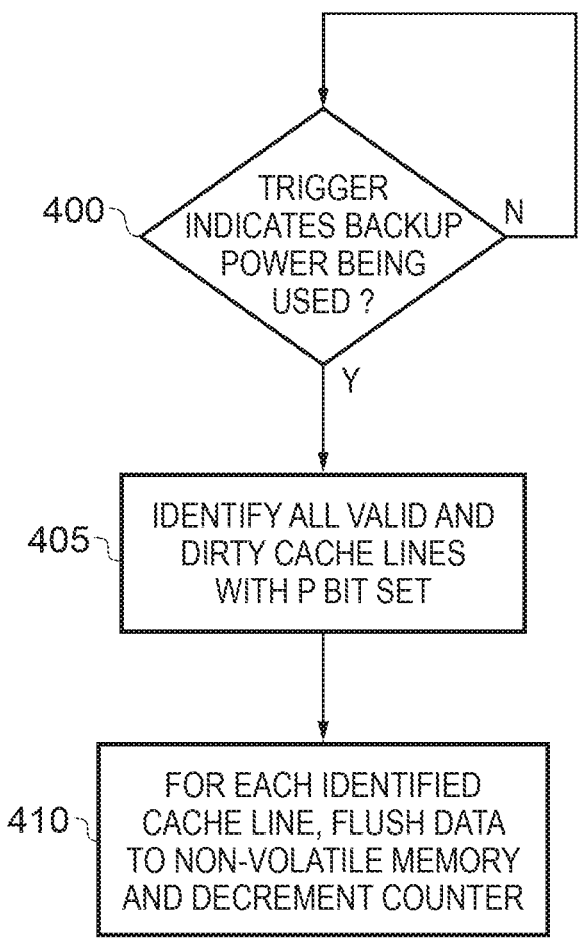

FIG. 6C is a flow diagram illustrating the backup power triggered eviction process when adopting the scheme of FIG. 6A. When at step 400 it is determined that the backup power has been triggered, then at step 405 all valid and dirty cache lines with their P bits set are identified, and thereafter at step 410, for each identified cache line, the data in that cache line is flushed to the non-volatile memory. As each cache line is evicted during this process, the counter is decremented.

As a variant to the approach shown in FIGS. 6A to 6C, the persistent bit 368 can be arranged so that it is only set when the associated cache line contents contain persistent data that is both valid and dirty, and it is only at this point that the counter is incremented. The specification of the maximum number of entries M will then typically be chosen taking into account the fact that only valid and dirty persistent data will be flagged by the persistent bit. During the performance of the process of FIG. 6B during allocation of data, then at step 390 the P bit will only be set if the allocated data is both valid and dirty, and only then will the counter be incremented. In accordance with this embodiment, when a cache line is initially allocated, it may be that the P bit is not set, but then if a write operation occurs in respect of one of the data values in that cache line in order to cause the content to become both valid and dirty, then at that point the persistent bit will be set and the counter incremented. The process performed in respect of backup power triggered eviction is then essentially the same as described with reference to FIG. 6C, but at step 405 it is only necessary to identify cache lines with the P bit set, because the P bit will only have been set for valid and dirty cache lines containing persistent data.

Figure 7:
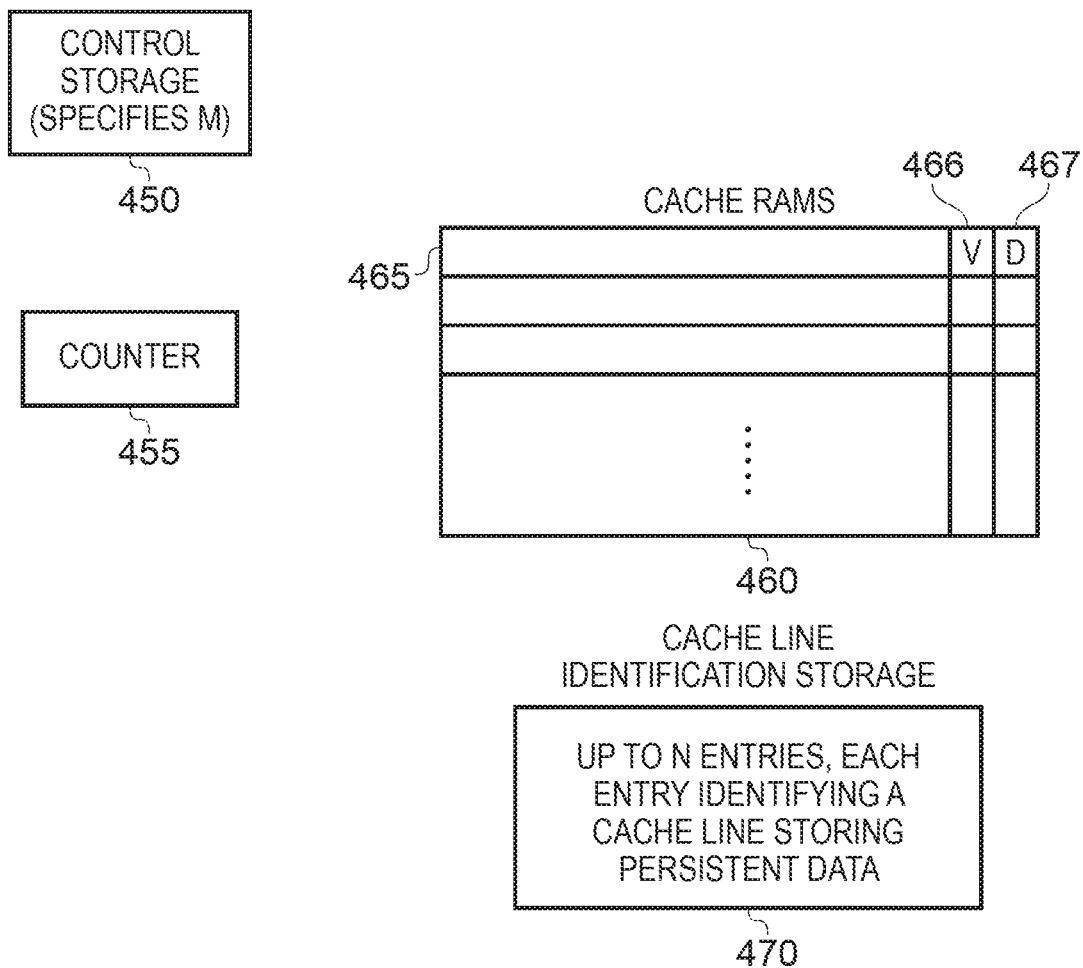
FIG. 7 illustrates an alternative mechanism for tracking which cache lines within the cache store persistent data in accordance with a further embodiment.

FIG. 7 illustrates an alternative arrangement to that shown in FIG. 6A, where a persistent bit 368 is not provided in association with each cache line, but instead a separate cache line identification storage 470 is provided. In accordance with this embodiment, control storage 450 specifies the maximum number of entries to be used to store persistent data, and the counter 455 is still provided. The cache RAMs 460 then include cache lines 465 that have associated valid and dirty bits 466, 467, but no persistence bit. Instead, whenever persistent data is allocated into a cache line, an entry is populated within the cache line identification storage 470 to identify the cache line that is storing the persistent data. This for example can take the form of a pointer to point to the appropriate cache line, or alternatively way and set identifier information.

With such an arrangement, the data allocation and backup power triggered eviction processes are similar to those discussed earlier with reference to FIGS. 6B and 6C, with the following changes. When performing the process of FIG. 6B, the entries in the cache line identification storage are populated rather than the P bit being set. When performing the backup power triggered eviction process of FIG. 6C, the step 405 instead requires all valid and dirty cache lines pointed to by an entry in the cache line identification storage 470 to be identified.

Further, as with the variant discussed earlier with reference to FIGS. 6A to 6C, it also possible to employ a variant of FIG. 7 where an entry is only made in the cache line identification storage 470 if a cache line stores persistent data that is both valid and dirty.

In one example arrangement, the non-volatile memory 25 can if desired incorporate some volatile storage, such as DRAM storage, but with that volatile storage being able to effectively be used as non-volatile memory via connection to the backup energy source 35. Such an arrangement is shown in FIG. 8.

Figure 8:
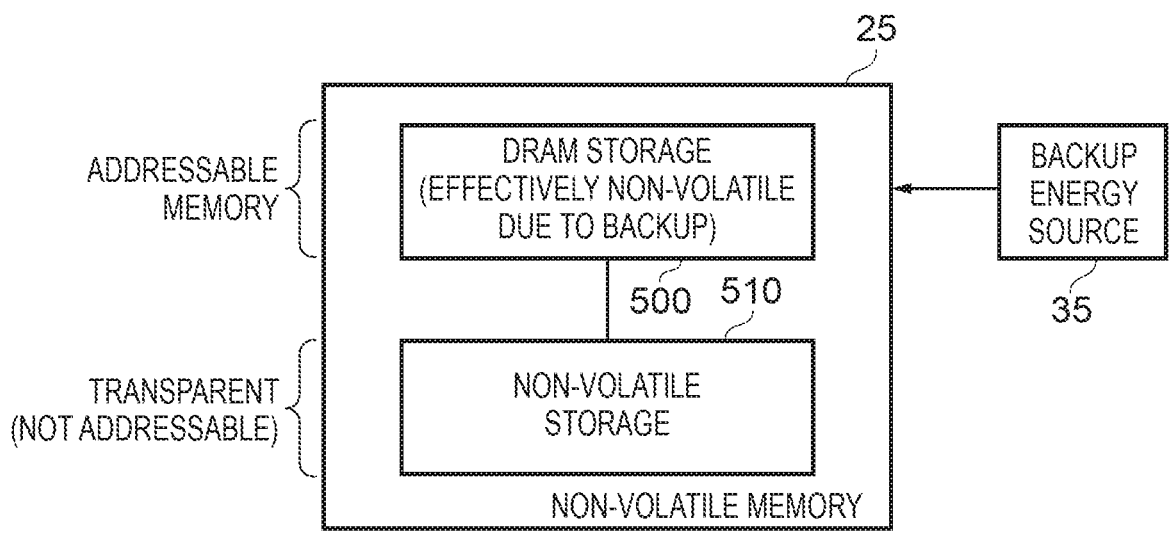
FIG. 8 illustrates an example arrangement of the non-volatile memory that may be used in one embodiment.

As shown in FIG. 8, in this example arrangement the addressable memory is actually formed from DRAM storage 500, and this is coupled to non-volatile storage 510 which is effectively transparent, in that it is not within the memory address map and accordingly its contents cannot directly be addressed by the processing circuitry 10. When data is allocated into memory, it is stored at the appropriate location within the DRAM storage 500 (as indicated by the specified memory address). Further, if that data is persistent data, it is copied into the non-volatile storage 510 so that that data can then be ensured to be persistent.

During the operations performed by the processing circuitry, the page table 45 (see FIG. 1) can be arranged to keep track of those pages in memory that have been written to, and which should accordingly be treated as dirty pages. With such information, in the event of an interruption in the power supply, the backup energy source 35 can be triggered, and the control circuitry associated with the non-volatile memory 25 can then identify the dirty pages, and cause those dirty pages to be copied from the DRAM storage 500 to the non-volatile storage 510 using the capacity of the backup energy source 35.

Such an approach can allow for faster access times in some embodiments, as volatile storage (e.g. DRAM) may typically be faster to access than non-volatile storage. Further, since only dirty pages that contain persistent data need to be backed up to the non-volatile storage in the event of a power failure, the size of the backup energy source 35 can be relatively small. In addition, the size of the non-volatile storage 510 can be reduced significantly, as it only needs to keep a copy of the persistent data.

In a yet further example arrangement, a block of volatile storage (such as DRAM) can be used to provide both the point of persistence cache 20, and the volatile storage 500 that can effectively be treated as non-volatile memory due to the connection to the backup energy source 35. In such an arrangement, the non-volatile storage 510 can be used as both persistent memory and non-persistent memory as discussed earlier, and at least part of that non-volatile storage will be addressable, in contrast to the arrangement shown in FIG. 8.

Part of the block of volatile storage can then be used as battery-backed persistent memory, in the same way as discussed earlier for that the DRAM storage block 500 of FIG. 8 (thus representing faster non-volatile memory, since DRAM is typically faster to access than the non-volatile storage 510). In addition, another part of the block of volatile storage can be used as a point of persistence cache for the non-volatile memory (to allow faster access, but in a transparent manner). The part of the volatile storage used as battery-backed memory is visible in the address space as fast persistent memory (in contrast to the non-volatile storage 510 which is treated as slower persistent memory). The part of the volatile storage used as a point of persistence cache is transparent (i.e. not directly addressable) and can cache entries from/to the non-volatile memory (to allow faster access). The capacity of the backup energy source is then used to allow backup to the non-volatile storage of the persistent dirty entries in both parts of the volatile storage.

Whilst the apparatus of the above described embodiments can be used in a variety of situations, one example use case is in connection with "Internet of Things" (IoT) devices which employ energy harvesting to provide their power. As a result, the energy stored may be ever-changing, and may depend on how much energy has been harvested. Power failures are expected to happen more frequently in such devices due to the nature of certain energy harvesting forms, and the IoT device needs to reboot correctly when power comes back. By using the above described techniques, a mechanism can be provided in such devices to ensure that data that needs to be retained as persistent can indeed be stored in a persistent manner.

From the above described embodiments, it will be seen that those embodiments allow a cache to be used as a capacity-limited point of persistence within a system, by constraining the extent to which the cache is used to store persistent data items taking into account the capacity of a backup energy source, thus ensuring that in the event of an interruption in the main power source, there will be sufficient energy available from the backup energy source to write back to non-volatile memory any persistent data currently held within that cache. This allows the cache to be made larger than would be the case if it had to be ensured that the entire contents of the cache could be written back to memory in the event of a power failure, and also allows the extent to which the cache is used for persistent data to be varied over time to take into account degradation in the capacity of the backup energy source. Further, the backup energy source can be made smaller for a given size of cache memory.

In the present application, the words "configured to . . ." are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function. "Configured to" does not imply that the apparatus element needs to be changed in any way in order to provide the defined operation.

Although illustrative embodiments of the invention have been described in detail herein with reference to the accompanying drawings, it is to be understood that the invention is not limited to those precise embodiments, and that various changes, additions and modifications can be effected therein by one skilled in the art without departing from the scope and spirit of the invention as defined by the appended claims. For example, various combinations of the features of the dependent claims could be made with the features of the independent claims without departing from the scope of the present invention.

The invention claimed is:

1. An apparatus comprising:
cache storage having a plurality of entries to cache data items associated with memory addresses in a non-volatile memory, the data items comprising persistent data items and non-persistent data items;
write back control circuitry to control write back of the data items from the cache storage to the non-volatile memory; and
cache usage determination circuitry to determine, in dependence on information indicative of capacity of a backup energy source, a subset of the plurality of entries to be used to store persistent data items;
wherein, in response to an event causing the backup energy source to be used, the write back control circuitry is arranged to initiate write back to the non-volatile memory of the persistent data items cached in said subset of the plurality of entries;
wherein the cache usage determination circuitry is arranged to perform a partitioning operation in order to partition the cache storage into a persistent region providing the subset of the plurality of entries to be used to store persistent data items and a non-persistent region providing entries other than the subset of the plurality of entries to be used to store persistent data items, and to generate usage control information that enables identification of the persistent region;
wherein the apparatus further comprises:
control storage to store the usage control information generated by the cache usage determination circuitry; and
allocation circuitry arranged after the usage control information has been stored in the control storage, to be responsive to a subsequent request that causes a new data item to be allocated in the cache storage, to reference the control storage when determining into which entry of the cache storage the new data item is to be allocated, such that when the new data item is a persistent data item an entry within the persistent region identified by the control information is selected by the allocation circuitry as the entry into which that new data item is allocated that new data item is allocated;

wherein, in response to said event causing the backup energy source to be used, the write back control circuitry is arranged to reference the control storage in order to determine which entries are to have their data items written back to the non-volatile memory.

2. An apparatus as claimed in claim 1, wherein, in response to said event causing the backup energy source to be used, the write back control circuitry is arranged to prevent write back to the non-volatile memory of the non-persistent data items.

3. An apparatus as claimed in claim 1, wherein the cache usage determination circuitry is responsive to a trigger event to perform the determination of the subset of the plurality of entries to be used to store persistent data items.

4. An apparatus as claimed in claim 3, wherein said trigger event comprises one or more of:
 a boot procedure performed on the apparatus;
 elapse of a chosen time interval since a previous determination of the subset of the plurality of entries to be used to store persistent data items; and
 an indication received from the backup energy source providing an updated indication of capacity.

5. An apparatus as claimed in claim 1, wherein the allocation circuitry is responsive to a request from a request source to allocate a new data item into the cache storage, on allocating said new data item into the cache storage when the new data item is a persistent data item, the allocation circuitry being arranged to issue an acknowledgement signal to the request source that confirms persistence of the new data item.

6. An apparatus as claimed in claim 1, wherein said usage control information identifies a borderline address between the persistent region and the non-persistent region.

7. An apparatus as claimed in claim 1, wherein said subset of the plurality of entries forming the persistent region comprises one or more of:
 a sequence of contiguous entries within the cache storage;
 a plurality of non-contiguous entries within the cache storage;
 a sequence of entries interleaved with entries forming the non-persistent region.

8. An apparatus as claimed in claim 1, wherein the request provides type information indicating whether the new data item is a persistent data item or a non-persistent data item.

9. An apparatus as claimed in claim 1, further comprising one or more page tables providing attributes for pages in the non-volatile memory, wherein for each page said attributes comprise a type attribute identifying whether data items within that page are persistent data items or non-persistent data items, and said type attribute is provided in association with said request.

10. An apparatus as claimed in claim 9, further comprising:
 one or more intervening levels of cache between the cache storage and processing circuitry;
 wherein for persistent data output by the processing circuitry for storage in the cache storage, the type attribute information is used to cause the one or more intervening levels of cache to operate in a write through mode for the persistent data.

11. An apparatus as claimed in claim 1, wherein the non-volatile memory comprises, in addition to non-volatile storage, a volatile storage to be coupled to the backup energy source and to operate as a region of addressable non-volatile memory, wherein in response to said event causing the backup energy source to be used, at least dirty persistent data stored in the volatile storage is copied to the non-volatile storage.

12. A method of handling caching of persistent data within a cache storage having a plurality of entries to cache data items associated with memory addresses in a non-volatile memory, the data items comprising persistent data items and non-persistent data items, the method comprising:
 employing write back control circuitry to control write back of the data items from the cache storage to the non-volatile memory;
 determining, in dependence on information indicative of capacity of a backup energy source, a subset of the plurality of entries to be used to store persistent data items;
 in response to an event causing the backup energy source to be used, causing the write back control circuitry to initiate write back to the non-volatile memory of the persistent data items cached in said subset of the plurality of entries;
 the determining of the subset of the plurality of entries to be used to store persistent data items comprising performing a partitioning operation in order to partition the cache storage into a persistent region providing the subset of the plurality of entries to be used to store persistent data items and a non-persistent region providing entries other than the subset of the plurality of entries to be used to store persistent data items, and to generate usage control information that enables identification of the persistent region;
 storing the usage control information generated by the partitioning operation in control storage;
 following storage of the usage control information in the control storage, responding to a subsequent request that causes a new data item to be allocated in the cache storage, referencing the control storage when determining into which entry of the cache storage the new data item is to be allocated, such that when the new data item is a persistent data item an entry within the persistent region identified by the control information is selected as the entry into which that new data item is allocated into the persistent region; and
 in response to said event causing the backup energy source to be used, referencing the control storage in order to determine which entries are to have their data items written back to the non-volatile memory.

13. An apparatus comprising:
 cache storage means having a plurality of entries for caching data items associated with memory addresses in a non-volatile memory, the data items comprising persistent data items and non-persistent data items;
 write back control means for controlling write back of the data items from the cache storage means to the non-volatile memory; and
 cache usage determination means for determining, in dependence on information indicative of capacity of a backup energy source, a subset of the plurality of entries to be used to store persistent data items;
 wherein, in response to an event causing the backup energy source to be used, the write back control means for initiating write back to the non-volatile memory of the persistent data items cached in said subset of the plurality of entries;
 wherein the cache usage determination means is for performing a partitioning operation in order to partition the cache storage means into a persistent region providing the subset of the plurality of entries to be used to store persistent data items and a non-persistent region providing entries other than the subset of the plurality of entries to be used to store persistent data items, and to generate usage control information that enables identification of the persistent region;

wherein the apparatus further comprises:

control storage means for storing the usage control information generated by the cache usage determination circuitry; and allocation means arranged after the usage control information has been stored in the control storage, to be responsive to a subsequent request that causes a new data item to be allocated in the cache storage means, for referencing the control storage means when determining into which entry of the cache storage means the new data item is to be allocated, such that when the new data item is a persistent data item an entry within the persistent region identified by the control information is selected by the allocation means as the entry into which that new data item is allocated into the persistent region;

wherein, in response to said event causing the backup energy source to be used, the write back control means is arranged to reference the control storage means in order to determine which entries are to have their data items written back to the non-volatile memory.

\* \* \* \* \*